United States Patent
Bonicatto (10) Patent No.: US 8,306,105 B2
(45) Date of Patent: Nov. 6, 2012

(54) SYSTEMS AND METHODS FOR PROCESSING A COMPOSITE SIGNAL

(75) Inventor: Damian G. Bonicatto, Pequot Lakes, MN (US)

(73) Assignee: Landis+Gyr Technologies, LLC, Pequot Lakes, MN (US)

( * ) Notice: Subject to any disclaimer, the term of this patent is extended or adjusted under 35 U.S.C. 154(b) by 570 days.

(21) Appl. No.: 12/608,078

(22) Filed: Oct. 29, 2009

(65) Prior Publication Data

US 2011/0103460 A1     May 5, 2011

(51) Int. Cl.
*H03K 7/08*     (2006.01)
(52) U.S. Cl. .................................................... 375/238
(58) Field of Classification Search .......... 375/237–239; 332/109, 112; 329/312, 313; 370/205
See application file for complete search history.

(56) References Cited

U.S. PATENT DOCUMENTS

2004/0156444 A1*   8/2004   Nakache et al. .............. 375/295

OTHER PUBLICATIONS

U.S. Appl. No. 12/608,124, Olson, Verne J., et al.

* cited by examiner

*Primary Examiner* — Kevin Kim
(74) *Attorney, Agent, or Firm* — Kilpatrick Townsend & Stockton LLP (57) ABSTRACT

An embodiment of a communication system can generate a composite signal that includes two or more different signals, where the signals represent different types of data. A data signal having one or more pulses that represent digital data of a first type is provided. A control signal that is a digital bit stream is provided. A composite signal is generated by multiplying a frequency of the data signal by a factor and modifying widths of pulses based on the bits of the control signal. The composite signal can be provided to a receiver device over a communication medium. The receiver device can determine the data signal and the control signal from the composite signal.

23 Claims, 6 Drawing Sheets

SYSTEMS AND METHODS FOR PROCESSING A COMPOSITE SIGNAL

FIELD OF THE DISCLOSURE

The present disclosure relates generally to signal processing and, more specifically, to various systems and methods for processing a composite signal formed from at least two signals representing different types of data.

BACKGROUND

Various types of communication systems can transmit and receive data as information in a signal. Some communication systems include interfaces between different communication networks. One example is a communication system for transmitting data over a power distribution network. The system can receive a data signal and then transmit the data signal onto a communication medium that includes cables and other mechanisms for delivering power. Another example is a telecommunications network that includes various types of communication mediums between which a transceiver can provide an interface.

In each example, the interfacing devices, such as transceivers and amplifiers, may be configured or otherwise controlled infrequently. For example, the devices may be configured during installation or configured after installation, such as by a technician, to modify various characteristics of device functions. Examples of characteristics may include amplification level, type of signal transmission, and frequency band of transmission.

Current methods for configuring devices may be unable to modify characteristics dynamically, based on current information about the communications network or other information. Furthermore, current methods for configuring devices may be unable to modify characteristics via a remote command center.

Accordingly, systems and methods are desirable that can allow characteristics of device functions to be configured remotely and, at least optionally, configured based on relatively current network information. Systems and methods may also be desirable that can be implemented using most current devices without requiring a complete replacement of a current system.

SUMMARY

Certain aspects and embodiments of the present invention are directed to a communication system that can generate a composite signal that includes two or more different signals, where the signals represent different types of data. One type of data may be used to configure device function characteristics. A data signal having pulses at one or more frequencies that represent digital data of a first type is provided. A control signal that is a digital bit stream is provided. A composite signal is generated by multiplying one or more frequencies of the data signal by a factor and modifying widths of pulses based on the bits of the control signal. The composite signal can be provided to a receiver device over a communication medium. The receiver device can determine the data signal and the control signal from the composite signal.

In one aspect, a transmitter device multiplies a frequency of a data signal by a factor. The data signal represents data of a first type and the data signal includes at least one pulse. The transmitter device generates a composite signal by modifying the pulse using a control signal. The control signal represents data of a second type. The composite signal represents data of the first type and data of the second type. The composite signal is transmitted to a communication medium.

In at least one embodiment, the composite signal propagating in the communication medium is recovered. The composite signal is decoded to determine the control signal representing the data of the second type from the composite signal. The frequency of the composite signal is divided by the factor to determine the data signal representing the data of the first type. The control signal is outputted and the data signal is outputted.

In at least one embodiment, the factor is a number that is greater than the number one.

In at least one embodiment, the pulse is modified by the control signal by identifying a leading edge of the pulse and modifying the width of the pulse an amount. The amount is based on a bit of the control signal. The composite signal is decoded to determine the control signal representing the data of the second type from the composite signal by identifying the leading edge of the pulse having a modified width, measuring the width, and determining the bit of the control signal based on a size of the width.

In at least one embodiment, a width of the pulse of the data signal is restored to a pre-modified width.

In at least one embodiment, the data signal includes frequency shift keying (FSK) data. The control signal includes a digital bit stream.

In at least one embodiment, the communication medium is at least one of a fiber optic cable, a wireline, a coaxial cable, or an air medium.

In another aspect, a system is provided that includes a transmitter device and a receiver device. The transmitter device can generate and transmit a composite signal that includes at least two signals representing different types of data. The transmitter device can multiply a frequency of a data signal by a factor. The data signal represents data of a first type and the data signal includes a pulse. The pulse is modified using a control signal to generate the composite signal. The control signal represents data of a second type. The composite signal is transmitted to a communication medium. The receiver device can determine the at least two signals representing different types of data. The receiver device can recover the composite signal propagating in the communication medium. The composite signal is decoded to determine the control signal representing the data of the second type from the composite signal. A frequency of the composite signal is divided by the factor to determine the data signal representing the data of the first type. The control signal and the data signal are outputted.

In at least one embodiment, the factor is two.

In at least one embodiment, the transmitter device and the receiver device are disposed in a power distribution substation.

In at least one embodiment, the power distribution substation includes a substation processing unit and a transformer coupler unit. The transmitter device is disposed in the substation processing unit. The receiver device is disposed in the transformer coupler unit.

In at least one embodiment, the transformer coupler unit includes an amplifier. The amplifier can amplify the data signal to a level for transmission onto a power distribution network. The level of amplification is controllable by the control signal.

In another aspect, a receiver device recovers a composite signal propagating in a communication medium. The composite signal includes at least two signals and the composite signal represents data of a first type and data of a second type. The composite signal is decoded to determine a control signal that represents data of the second type by identifying a pulse of the composite signal, measuring a width of the pulse, and determining a bit of the control signal based on a size of the width of the pulse. A frequency of the composite signal is divided by two to determine a data signal that represents the data of the first type. The control signal and the data signal are outputted.

In at least one embodiment, a transmitter device multiplies a frequency of the data signal by two. The data signal represents data of the first type and the data signal includes the pulse. The transmitter device generates the composite signal by modifying the pulse using the control signal. The control signal represents data of the second type. The composite signal is transmitted to the communication medium.

In at least one embodiment, the pulse is modified is modified using the control signal by identifying the pulse and modifying the width of the pulse an amount that is determined based on the bit of the control signal.

These illustrative embodiments are mentioned not to limit or define the invention, but to provide examples to aid understanding thereof. Other aspects, advantages, and features of the present invention will become apparent after review of the entire application, including the following sections: Brief Description of the Drawings, Detailed Description, and Claims.

DETAILED DESCRIPTION

Introduction

Certain aspects and embodiments of the present invention provide a communication system that can generate a composite signal that includes two or more different signals, where each of the signals represents different types of data. In one embodiment, a data signal is provided that is frequency shift keying (FSK) data represented by a series of pulses at one or more frequencies. Pulses a first frequency may represent a digital "1" and pulses at a second frequency may represent a digital "0". A control signal that is a digital bit stream is provided. A composite signal can be generated by multiplying each of the one or more frequencies of the data signal by a factor, such as two, and modifying widths of pulses based on the control signal. The composite signal can be provided to a receiver device over a communication medium. The receiver device can determine the data signal and the control signal from the composite signal.

In some embodiments, the control signal can be used to configure a device or otherwise. The data signal can be transmitted by the device configured by the control signal.

Illustrative System Implementation

Figure 1:
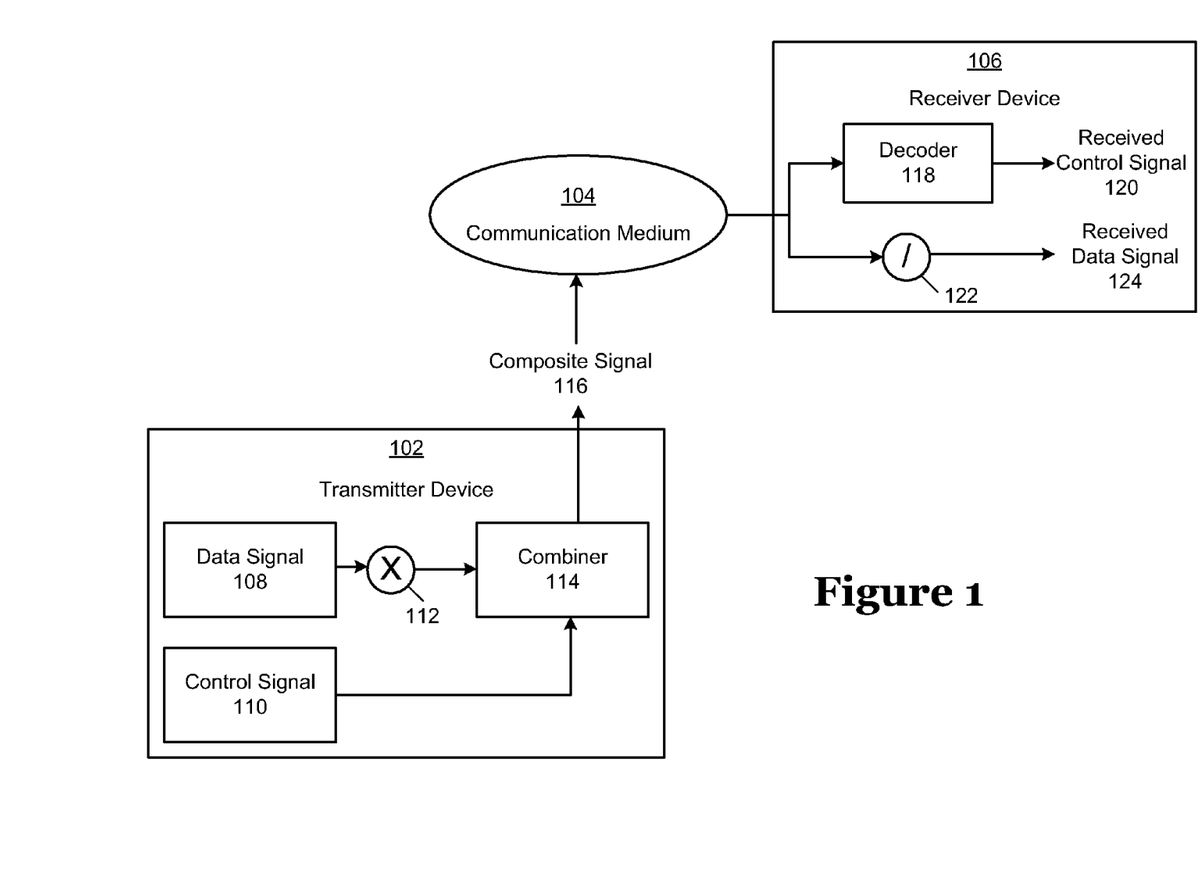
FIG. 1 is a block diagram of a transmitter device capable of transmitting a composite signal and a receiver device capable of receiving a composite signal according to one embodiment of the present invention.

FIG. 1 depicts one embodiment of a communication system according to the present invention. The communication system includes a transmitter device 102 that is capable of providing a composite signal 116 through a communication medium 104 to a receiver device 106. Although transmitter device 102 is depicted as a single device, some embodiments of transmitter device 102 can include more than one transmitter device and can include (or be associated with) a receiver device that is capable of receiving signals from another device that is not shown and capable of receiving signals from receiver device 106. Similarly, some embodiments of receiver device 106 can include more than one receiver device and can include (or be associated with) a transmitter device that is capable of transmitting signals to another device, including the transmitter device 102.

Communication medium 104 may be any medium that can allow signals to be transmitted through it. Examples of communication medium 104 include a fiber optic cable, a wireline, a coaxial cable, an air medium, power line, or any other suitable medium.

The transmitter device 102 includes a data signal 108. Data signal 108 may be received by the transmitter device 102 from another device or may be generated by the transmitter device 102. The data signal 108 can represent data of a first type. Examples of data signal 108 include FSK data or any digital data represented by square waves, saw tooth waveforms, or other pulse representation. The data signal 108 may be a signal to be provided onto a communications network, such as a network that is a power distribution network, a telecommunications network, or a transatlantic cable network.

The transmitter device 102 also includes a control signal 110. Control signal 110 may be received by the transmitter device 102 from another device or may be generated by the transmitter device 102. The control signal 110 can represent data of a second type. Examples of control signal 110 include a digital bit stream that includes any waveform or configuration that can represent a digital "1" or a digital "0". The control signal may be a signal that can be used to configure a device associated with the receiver device 106.

The transmitter device 102 is configured to generate a composite signal 116 that includes both the data signal 108 and the control signal 110. The composite signal can be generated by multiplying a frequency of the data signal 108 by a factor and combining the frequency-multiplied data signal with the control signal 110. The transmitter device 102 can include a multiplier 112 that is capable of multiplying the frequency of the data signal 108 by the factor. The factor may be any whole number that is greater than one. In some embodiments, the factor is two or another even number. The multiplier 112 may be any device that is capable of multiplying the frequency of the data signal. In some embodiments, the multiplier 112 is a frequency doubler (e.g. a device capable of multiplying a frequency by a factor of two) having circuitry capable of outputting a signal having a 50% duty cycle.

The transmitter device 102 also includes a combiner 114 for combining the frequency-multiplied data signal with the control signal 110. The combiner 114 can modify pulses of the data signal using the control signal to generate the composite signal. In some embodiments, the combiner 114 identifies a pulse of the data signal by detecting a leading edge of the pulse. The combiner 114 can change the width of the pulse based on a bit of the control signal. For example, the combiner 114 may increase the width of the pulse if the control signal bit is a digital "1" and decrease the width of the pulse if the control signal bit is a digital "0".

The output of the combiner 114 is a signal that is a composite signal representing both data types of the data signal 108 and of the control signal 110. The transmitter device 102 can transmit the composite signal 116 to the communication medium 104. The receiver device 106 can recover the composite signal 116 propagating in the communication medium 104 and process it to determine the data from each type of data represented by the composite signal 116. In some embodiments, the receiver device 106 determines the data from each of the signals by processing the composite signal 116 using two processes operating concurrently. In other embodiments, the receiver device 106 determines data of the second type and then data of the first type in successive processes.

The receiver device 106 includes a decoder 118 that can determine the received control signal 120 from the composite signal 116. For example, the decoder 118 may identify pulses of the composite signal 116 by identifying a leading edge of each pulse and may determine a width for each of the identified pulses. The width of a pulse can correspond to a digital bit of the received control signal 120.

A frequency divider 122 may be used to process the composite signal 116 concurrently to determine the received data signal 124. For example, the frequency of the composite signal may be divided by the factor. The resulting signal may be the received data signal 124. In some embodiments, the width of the pulses may be restored by the receiver device 106 and the resulting signal with restored pulse widths is the received data signal 124.

The received control signal 120 may be used to modify functional characteristics of a device associated with the receiver device 106. For example, a transmitter device that may be connected directly to the receiver device 106 can transmit the received data signal 124 onto a communications network and characteristics, such as amplification level and transmission mode, may be controlled by the received control signal 120.

Illustrative Methods for Communicating Data

Figure 2A:
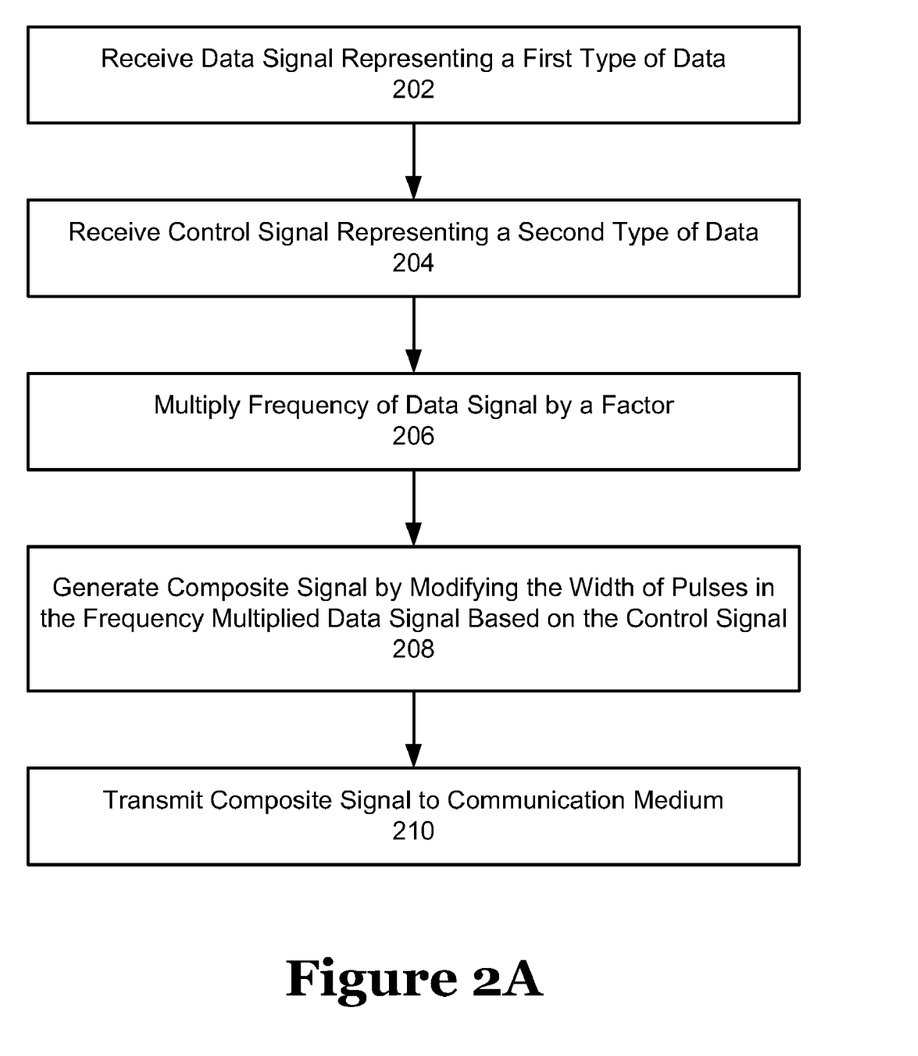
FIG. 2A is a flow diagram of a process for generating and transmitting a composite signal according to one embodiment of the present invention.
Figure 2B:
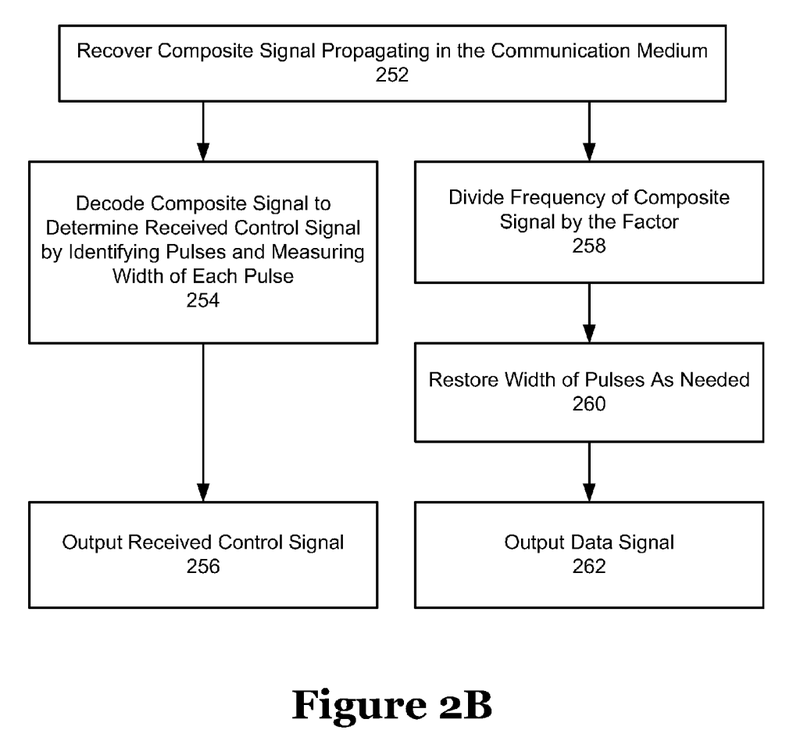
FIG. 2B is a flow diagram of a process for determining signals from the composite signal according to one embodiment of the present invention.

FIGS. 2A and 2B illustrate certain embodiments of methods for generating and transmitting a composite signal and receiving and processing the composite signal. The transmitter device methods shown in FIG. 2A and the receiver device methods shown in 2B are described with reference to the system block diagram of FIG. 1 and the signals depicted in FIGS. 3 and 4.

In block 202, the transmitter device 102 receives a data signal 108 that represents a first type of data. The data signal 108 may be received from a source, such as an endpoint of a power distribution network or a central command center in communication with the transmitter device 102 through the power distribution network or another communication network. In other embodiments, the transmitter device 102 generates the data signal 108 in accordance with instructions received from a source or otherwise.

Figure 3:
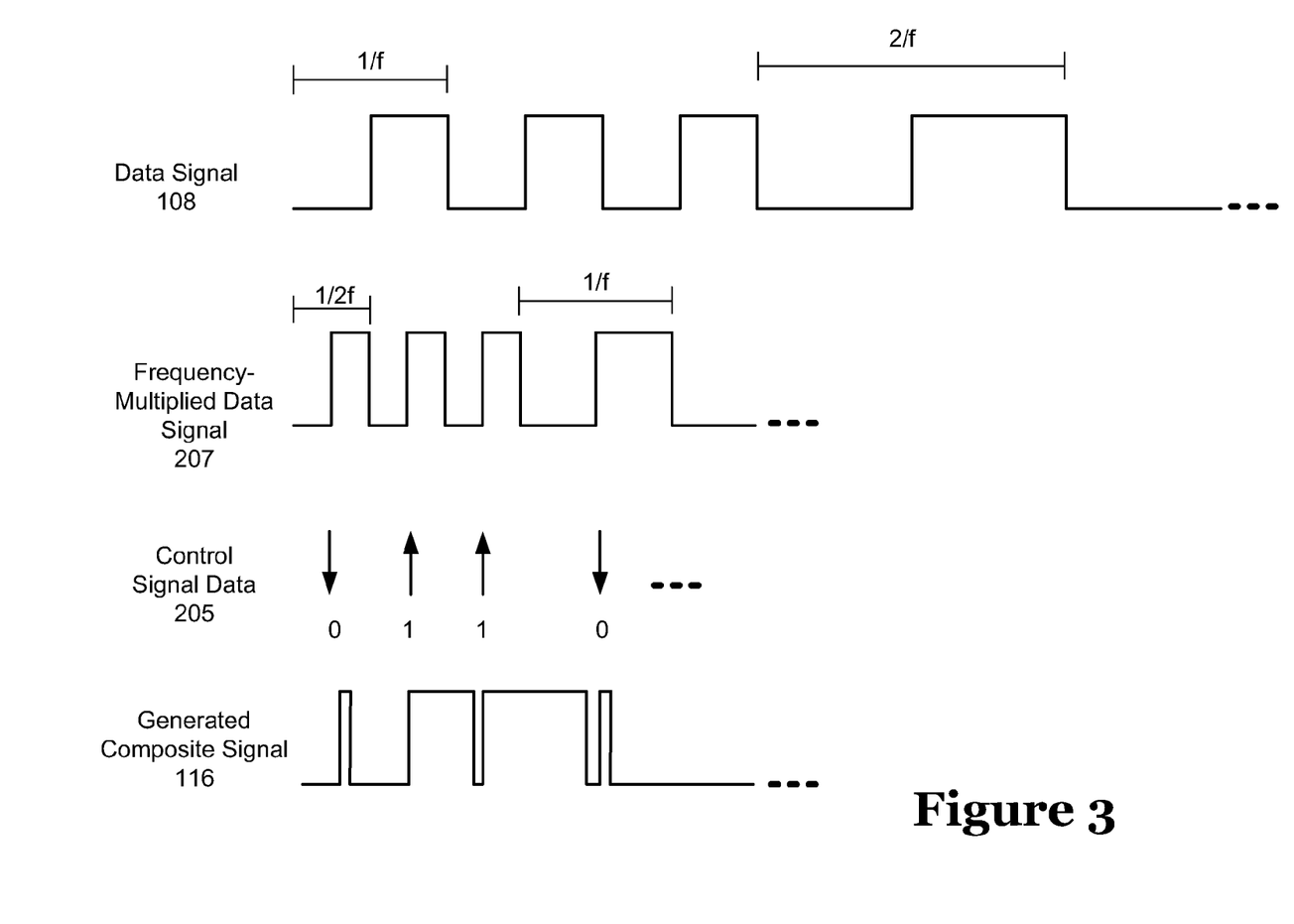
FIG. 3 illustrates a composite signal and signals for forming a composite signal according to one embodiment of the present invention.

The data signal 108 may be frequency shift keying (FSK) data represented by pulses at one or more frequencies. An example of a data signal 108 is depicted in FIG. 3. It illustrates a series of pulses at two different frequencies (1/f and 2/f) that represent bits of data. For example, pulses at frequency 1/f can represent a digital bit value of "1" and pulses at frequency 2/f can represent a digital bit value of "0". The data signal 108 may have any desirable frequency characteristics. For example, the frequency of the data signal 108 may be in a range of 540 Hz-600 Hz. In some embodiments, the data signal 108 has a frequency of 555 Hz or 585 Hz and the digital data bits are represented by a change in tone.

In block 204, the transmitter device 102 receives a control signal 110 that represents a second type of data. The control signal 110 may be received from a source, such as an endpoint or a central command center, or generated by the transmitter device 102 in accordance with instructions received from a source or otherwise. The control signal 110 may be a digital bit stream that represents data for configuring a device associated with the receiver device 106. The control signal 110 may be any form. In some embodiments, the control signal 110 is an analog waveform, pulse waveform, other waveform capable of representing a digital bit stream. An example of control signal data 207 that may be represented by the control signal 110 is shown in FIG. 3.

In block 206, the multiplier 112 multiplies one or more frequencies of the data signal 108 by a factor. The factor may be any number greater than one that can be used to modify the frequencies of the data signal 108. In some embodiments, the factor is two or a multiple of two (e.g. four, six, eight, etc.). For example, multiplying the frequencies by two doubles the frequencies and may result in the data signal 108 having a 50% duty cycle. An example of a frequency-multiplied data signal 205 is depicted in FIG. 3.

In block 208, the combiner 114 generates the composite signal 116 by modifying the width of pulses in the frequency-multiplied data signal based on the control signal 110. For example, each pulse of the frequency-multiplied data signal may be modified by a bit in the digital data stream of the control signal 110. The width of the pulse can be changed to a smaller width if the bit in the digital data stream of the control signal 110 is a digital "0" and can be changed to a larger width if the bit in the digital data stream of the control signal 110 is a digital "1".

In some embodiments, the combiner 114 detects a leading edge of a pulse in the frequency-multiplied data signal to identify a pulse. The combiner 114 may detect a falling edge of the pulse to identify an end to the pulse and to identify its associated width.

The combiner 114 may receive the next bit in the digital bit stream of the control signal 110 and modify the width of the pulse according to the bit. The width may be changed to an amount that is greater than 25% of the initial frequency of the data signal 108 if the bit is a digital "1" and changed to an amount that is less than or equal to 25% of the initial frequency of the data signal 108 if the bit is a digital "0". In some embodiments, the width of the pulse is changed to an amount that is or about 90% of the frequency of the frequency-multiplied data signal if the bit is a digital "1" and changed to an amount that is or about 10% of the frequency of the frequency-multiplied data signal if the bit is a digital "0". FIG. 3 depicts an example of a generated composite signal 116. The generated composite signal 116 includes the frequency-multiplied data signal and the control signal in one signal.

In block 210, the transmitter device 102 transmits the composite signal 116 to the communication medium 104. The transmitter device 102 can use any transmission method to propagate the composite signal 116 to the communication medium 104. The composite signal 116 can propagate in communication medium 104 and the receiver device 106 can receive it from the communication medium 104 as shown in FIG. 2B.

In block 252 of FIG. 2B, the receiver device 106 recovers the composite signal 116 propagating in the communication medium 104. The recovered composite signal 116 may be provided to two or more components at the same or about the same time to provide parallel signal processing to determine the two different signals included in the composite signal. For example, the composite signal 116 can be provided to the decoder 118 and the frequency divider 122 substantially simultaneously. In some embodiments, the receiver device 106 is configured with expected signal characteristics, such as an expected width of a pulse representing a control signal bit of "0" and an expected width of a pulse representing a control signal bit of "1". The receiver device 106 may also be configured with an expected width of pulses for the data signal to assist the receiver device 106, for example, in restoring the data signal.

Figure 4:
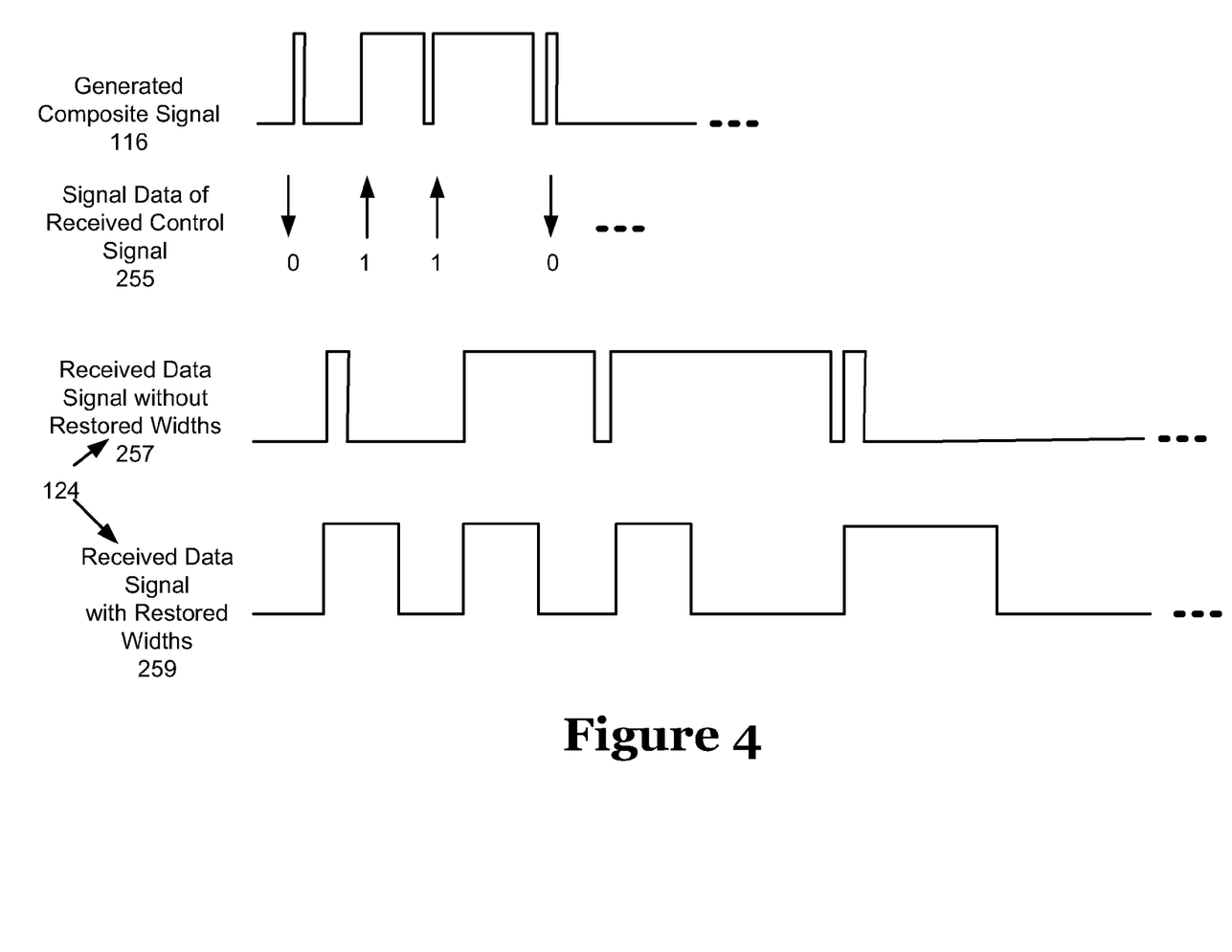
FIG. 4 illustrates a composite signal and signals determined from the composite signal according to one embodiment of the present invention.

In block 254, the decoder 118 decodes the composite signal 116 to determine the received control signal 120 by identifying the pulse or pulses of the composite signal 116 and measuring the width of each pulse. Each pulse can be identified by identifying a leading edge of the pulse. The width of each pulse can be determined by identifying a falling edge of the pulse and measuring an amount between the leading edge of the pulse and the falling edge of the pulse. For example, a width amount that is or greater than a specified amount is a control signal data bit of digital "1" and a width amount that is or less than a specified amount is a control signal data bit of digital "0". The decoder 118 can analyze each pulse of the composite signal 116 to determine the received control signal 120 and the received control signal data. FIG. 4 depicts an example of control signal data 255 that may be determined by the decoder 118.

In block 256, the receiver device 106 outputs the received control signal 120. The data of the received control signal 120 can be used to configure or otherwise control a device associated with the receiver device 106.

In block 258, the frequency divider 122 divides the one or more frequencies of the composite signal 116 by the factor. The factor may be the same factor by which the multiplier 112 multiplied the data signal 108. In other embodiments, the factor is a different factor than the factor used by the multiplier 112. The resulting signal may be the received data signal 124. For example, the receiver device 106 can include circuitry that identifies each pulse by detecting a leading edge of each pulse and, based on the frequency of the pulses, determining the bit values that the data signal 124 represents. FIG. 4 depicts an example of a data signal without restored widths 257 that may be the received data signal 124.

In block 260, the receiver device 106 restores the width of the pulses as needed. Although the data signal without restored widths 257 may be used as the received data signal 124, some implementations may recondition the received data signal 124 to restore the width of pulses to the same as or similar to the widths of the data signal 108 pulses. For example, the receiver device 106 may restore the width of pulses changed during composite signal generation. A width that was shortened in accordance with a control signal data bit of digital "0" may be lengthened to its initial width and a width that was lengthened in accordance with a control signal data bit of digital "1" may be shortened to its initial width. The bit values of the data signal 124 can be determined from the one or more frequencies as represented by the pulses with restored widths. An example of a received data signal with restored widths 259 is depicted in FIG. 4. The received data signal with restored widths 259 may be the received data signal 124.

The received data signal 124 can be provided to the device configured or controlled by the received control signal 120. The device can be associated with the receiver device 106 and can further process, transmit, or otherwise use the received data signal 124.

Exemplary Implementations

Figure 5:
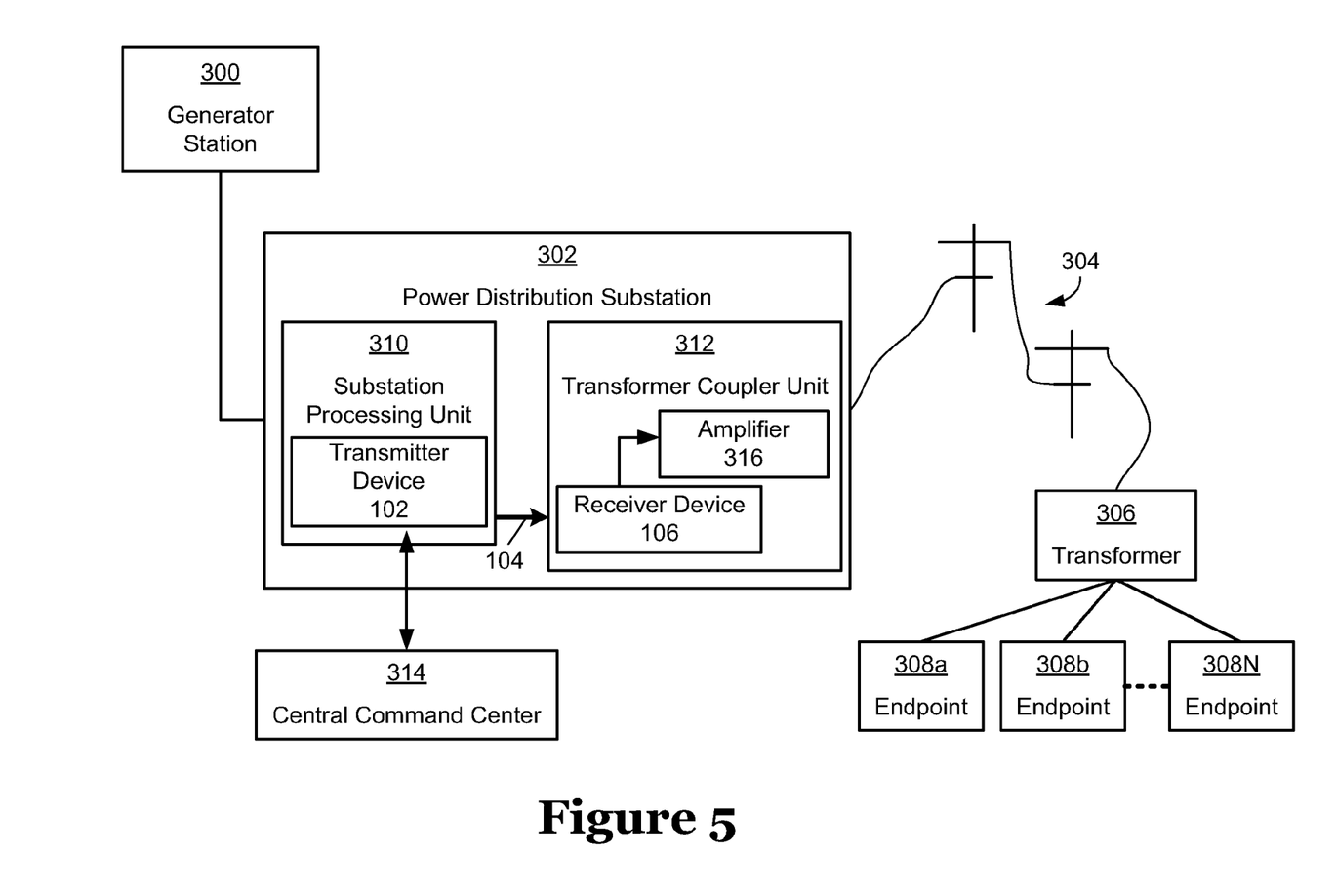
FIG. 5 illustrates the transmitter device and receiver device of FIG. 1 disposed in a power distribution substation in a power distribution network according to one embodiment of the present invention.

Communication systems according to various embodiments of the present invention can be used in a variety of implementations. Examples of implementations include using the communication system in a power distribution network, in a telecommunications network, and in a transatlantic cable system. FIG. 5 depicts an embodiment of the transmitter device 102 and the receiver device 106 disposed in a power distribution substation 302 of a power distribution network.

A generator station 300 generates power and provides it to the power distribution substation 302 over high voltage power transmission cables or otherwise. The power distribution substation 302 includes transformers (not shown) that can change the voltage level of the power from a high voltage level to a level that is suitable for distribution. The lower level power is provided through power lines 304 to a transformer 306 that lowers the voltage level to a level that is usable at consumer locations associated with endpoints 308a-N.

The power distribution substation 302 can include devices that are configured to communicate over the power lines 304 with each of the endpoints 308a-N. The devices can include a substation processing unit 310 and a transformer coupler unit 312. The substation processing unit 310 can include circuitry that is configured to collect or otherwise receive data to be provided to one or more of the endpoints 308a-N. The transformer coupler unit 312 can interface with the power lines 304 through a transformer (not shown) or otherwise provide the data to one or more of the endpoints 308a-N through power lines 304.

The transmitter device 102 is disposed in the substation processing unit 310 and may be in communication with a central command center 314 over a telecommunications network, such as through an Ethernet connection, over the power lines 304, or other type of connection. The central command center 314 can provide a control signal to the substation processing unit 310. The control signal can include data to configure a component in the power distribution substation 302, such as amplifier 316. In some embodiments, the central command center 314 also provides a data signal that includes data to be provided to the endpoints 308a-N. The transmitter device 102 can generate a composite signal that includes the data signal and the control signal and provide the composite signal to the transformer coupler unit 312 through the communication medium 104. In some embodiments, the communication medium 104 is a fiber optic cable.

The receiver device 106 is disposed in the transformer coupler unit 312. The receiver device 106 can recover the composite signal and determine the control signal and the data signal from the composite signal. The transformer coupler unit 312 can use the control signal to configure the amplifier 316 for amplifying the data signal. For example, the control signal may be used to increase or decrease the amplification level of the amplifier 316.

The foregoing description of the exemplary embodiments of the invention has been presented only for the purposes of illustration and description and is not intended to be exhaustive or to limit the invention to the precise forms disclosed.

Many modifications and variations are possible in light of the above teaching. The embodiments were chosen and described in order to explain the principles of the invention and their practical application to enable others skilled in the art to utilize the invention and various embodiments and with various modifications as are suited to the particular use contemplated. Alternative embodiments will become apparent to those skilled in the art to which the present invention pertains without departing from its spirit and scope.

What is claimed is:

1. A method comprising:
recovering, by a receiver device, a composite signal propagating in a communication medium, the composite signal comprising at least two signals and the composite signal representing data of a first type and representing data of a second type;
decoding the composite signal to determine a control signal representing the data of the second type by:
identifying at least one pulse of the composite signal;
measuring a width of the at least one pulse; and
determining a bit of the control signal based on a size of the width of the at least one pulse;
dividing a frequency of the composite signal by two to determine a data signal representing the data of the first type;
outputting the control signal; and
outputting the data signal.

2. The method of claim 1, further comprising:
multiplying, by a transmitter device, a frequency of the data signal by two, the data signal representing data of the first type and the data signal comprising the at least one pulse;
generating, by the transmitter device, the composite signal by modifying the at least one pulse using the control signal, the control signal representing data of the second type; and
transmitting the composite signal to the communication medium.

3. The method of claim 2, wherein modifying the at least one pulse using the control signal comprises:
identifying the at least one pulse; and
modifying the width of the at least one pulse an amount, the amount being determined based on the bit of the control signal.

4. The method of claim 2, further comprising:
restoring, by the receiver device, the width of the at least one pulse of the data signal to a width corresponding to a pre-modified width.

5. The method of claim 1, wherein data of the first type comprises frequency shift keying (FSK) data.

6. The method of claim 1, wherein the communication medium is at least one of:
a fiber optic cable;
a wireline;
a coaxial cable; or
an air medium.

7. A system comprising:
a transmitter device configured to generate and transmit a composite signal comprising at least two signals representing different types of data by:
multiplying a frequency of a data signal by a factor, the data signal representing data of a first type and the data signal comprising at least one pulse;
modifying the at least one pulse using a control signal to generate the composite signal, the control signal representing data of a second type; and
transmitting the composite signal to a communication medium;
a receiver device configured to determine the at least two signals representing different types of data by:
recovering the composite signal propagating in the communication medium;
decoding the composite signal to determine the control signal representing the data of the second type from the composite signal;
dividing a frequency of the composite signal by the factor to determine the data signal representing the data of the first type;
outputting the control signal; and
outputting the data signal.

8. The system of claim 7, wherein the transmitter device is configured to modify the at least one pulse using the control signal by:
identifying a leading edge of the at least one pulse; and
modifying a width of the at least one pulse an amount, the amount being determined based on a bit of the control signal.

9. The system of claim 8, wherein the receiver device is configured to decode the composite signal to determine the control signal representing the data of the second type from the composite signal by:
identifying the leading edge of the at least one pulse having a modified width;
measuring the width of the at least one pulse; and
determining the bit of the control signal based on a size of the width of the at least one pulse.

10. The system of claim 9, wherein the receiver device is configured to restore the width of the at least one pulse of the data signal to a width corresponding to a pre-modified width.

11. The system of claim 7, wherein the data signal comprises frequency shift keying (FSK) data,
wherein the control signal comprises a digital bit stream.

12. The system of claim 7, wherein the factor is two.

13. The system of claim 7, wherein the communication medium is at least one of:
a fiber optic cable;
a wireline;
a coaxial cable; or
an air medium.

14. The system of claim 7, wherein the transmitter device and the receiver device are disposed in a power distribution substation.

15. The system of claim 14, wherein the power distribution substation comprises a substation processing unit and a transformer coupler unit,
wherein the transmitter device is disposed in the substation processing unit and the receiver device is disposed in the transformer coupler unit.

16. The system of claim 15, wherein the transformer coupler unit comprises an amplifier, the amplifier being configured to amplify the data signal to a level for transmission onto a power distribution network, wherein the level of amplification is controllable by the control signal.

17. A method comprising:
multiplying, by a transmitter device, a frequency of a data signal by a factor, the data signal representing data of a first type and the data signal comprising at least one pulse;
generating, by the transmitter device, a composite signal by modifying the at least one pulse using a control signal, the control signal representing data of a second type for configuring a device associated with a receiver device, wherein the composite signal represents the data of the first type and the data of the second type; and transmitting the composite signal to a communication medium.

18. The method of claim 17, further comprising:

recovering the composite signal propagating in the communication medium;

decoding the composite signal to determine the control signal representing the data of the second type from the composite signal;

dividing a frequency of the composite signal by the factor to determine the data signal representing the data of the first type;

outputting the control signal; and outputting the data signal.

19. The method of claim 18, wherein the factor comprises a number that is the greater than the number one.

20. The method of claim 18, wherein modifying the at least one pulse using the control signal comprises:

identifying a leading edge of the at least one pulse; and modifying a width of the at least one pulse an amount, the amount being determined based on a bit of the control signal.

21. The method of claim 20, wherein decoding the composite signal to determine the control signal representing the data of the second type from the composite signal comprises:

identifying the leading edge of the at least one pulse having a modified width;

measuring the width of the at least one pulse; and determining the bit of the control signal based on a size of the width of the at least one pulse.

22. The method of claim 21, further comprising:

restoring a width of the at least one pulse of the data signal to a width corresponding to a pre-modified width.

23. The method of claim 21, wherein the data signal comprises frequency shift keying (FSK) data, wherein the control signal comprises a digital bit stream.

* * * * *